United States Patent
Floyd et al.

(10) Patent No.: US 11,636,237 B2
(45) Date of Patent: Apr. 25, 2023

(54) COMPRESSING BINARY GEOMETRY FILES FOR STRUCTURAL PRODUCTS

(71) Applicant: THE BOEING COMPANY, Chicago, IL (US)

(72) Inventors: Joseph F. Floyd, University Place, WA (US); Patrick J. Eames, Newcastle, WA (US); Brent L. Hadley, Kent, WA (US); Robert J. Martin, Seattle, WA (US); Jeremy D. Scott, Lynnwood, WA (US)

(73) Assignee: The Boeing Company, Chicago, IL (US)

( * ) Notice: Subject to any disclaimer, the term of this patent is extended or adjusted under 35 U.S.C. 154(b) by 217 days.

(21) Appl. No.: 16/863,592

(22) Filed: Apr. 30, 2020

(65) Prior Publication Data

US 2021/0342499 A1 Nov. 4, 2021

(51) Int. Cl.
*G06F 30/15* (2020.01)
*G06F 8/52* (2018.01)
*G06T 17/20* (2006.01)

(52) U.S. Cl.
CPC ............ *G06F 30/15* (2020.01); *G06F 8/52* (2013.01); *G06T 17/20* (2013.01)

(58) Field of Classification Search
CPC . G06F 30/15; G06F 8/52; G06T 17/20; G06T 9/001
See application file for complete search history.

(56) References Cited

U.S. PATENT DOCUMENTS

| 5,870,094 A * | 2/1999 | Deering et al. ............... 345/419 |
| 8,542,911 B1 * | 9/2013 | Korobkin et al. ............ 382/154 |
| 10,417,803 B2 | 9/2019 | Floyd et al. |
| 2016/0342713 A1 * | 11/2016 | McQuiston ............ G06F 30/15 |
| 2017/0365086 A1 * | 12/2017 | Floyd et al. .................. 345/420 |

OTHER PUBLICATIONS

"IFC Compressor: A content-based compression algorithm for optimizing Industry Foundation Classes files" Jing Sun el at. (Year: 2014).*

(Continued)

*Primary Examiner* — Eunhee Kim
(74) *Attorney, Agent, or Firm* — Womble Bond Dickinson (US) LLP (57) ABSTRACT

A method is provided for compressing a binary geometry file for a structural product. The method includes accessing the binary geometry file that contains a geometric model of a structural product that is formed of component parts, the geometric model including an assembly of geometric models of instances of the component parts. The method includes identifying the component parts of the structural product, and generating a master binary geometry file for the structural product that contains geometric models of the component parts. The method includes applying the binary geometry file to a coder that generates a corresponding compressed binary geometry file. The coder searches the binary geometry file for the geometric models of the instances of the component parts, and substitutes references to respective ones of the geometric models of the component parts in the master binary geometry file.

20 Claims, 8 Drawing Sheets

(56) References Cited

OTHER PUBLICATIONS

"Removing duplicated geometries in IFC models using rigid body transformation estimation and flyweight design pattern" Vonthron et al. (Year: 2018).*

Xue, Junjie, Gang Zhao, and Wenlei Xiao. "An efficient GPU out-of-core framework for interactive rendering of large-scale CAD models." Computer Animation and Virtual Worlds 27.3-4 (2016): 231-240. (Year: 2016).*

Xue, Junjie, Gang Zhao, and Wenlei Xiao. "Efficient GPU out-of-core visualization of large-scale CAD models with voxel representations." Advances in Engineering Software 99 (2016): 73-80. (Year: 2016).*

Peng, Chao, and Yong Cao. "Parallel LOD for CAD model rendering with effective GPU memory usage." Computer-Aided Design and Applications 13.2 (2016): 173-183. (Year: 2016).*

Quintana, Virgilio, et al. "Re-engineering the Engineering Change Management process for a drawing-less environment." Computers in Industry 63.1 (2012): 79-90. (Year: 2012).*

Xue, Junjie, and Gang Zhao. "Interactive rendering and modification of massive aircraft CAD models in immersive environment." Computer-Aided Design and Applications 12.4 (2015): 393-402. (Year: 2015).*

Vonthron, et al., "Removing duplicated geometries in IFC models using rigid body transformation estimation and flyweight design pattern", Visualization in Engineering, vol. 6, No. 1, 2018, pp. 1-15.

* cited by examiner

COMPRESSING BINARY GEOMETRY FILES FOR STRUCTURAL PRODUCTS

TECHNOLOGICAL FIELD

The present disclosure relates generally to data compression and, in particular, to compressing binary geometry files for structural products such as aircraft or other vehicles.

BACKGROUND

In the past, engineers who designed and maintained aircraft created or relied on detailed two-dimensional (2D) drawings of all the aircraft parts on large sheets of Mylar or similar media in which the drawings were numbered in a logical manner. This logical numbering of drawings enabled engineers, technicians and maintenance personnel familiar with the drawing organization (or, "drawing tree") to locate the design details of a system (e.g., main landing gear, hydraulic pump) to facilitate a number of functions from manufacture to troubleshooting to assembly/disassembly for maintenance.

Many large and complex aircraft and other similar structures are today designed using computer aided design (CAD) software that enables the digital design and display of the structure in three-dimensions (3D). Display of an aircraft and its parts in 3D has many advantages over 2D drawings. As compared to 2D drawings, a 3D display of an aircraft enables engineers, technicians and maintenance persons to more easily understand how the aircraft is assembled and it makes it much easier to visualize individual parts and find out information about the part (e.g., part number and part name).

Notwithstanding its improvement over 2D drawings, a 3D model of a large and complex structure such as an aircraft presents its own challenges. The 3D model of a modern aircraft composed of millions of individual parts may be greater than 4 terabytes in size. The size of the 3D model and limitations of computing hardware make it difficult, if even possible, to view all of the parts at one time. Unless the user has access to a super-computer, which is not commonly available, the user cannot view the entire aircraft at one time.

Compression technology exists to enable the user to view an entire aircraft on a personal computer, tablet computer or the like. A 3D model of an aircraft can be compressed into a file size of around 8 gigabytes. Although adequate for a single model, existing compression technology may nonetheless be inadequate or even impractical for airlines who operate large fleets (e.g., more than 20 airplanes) to store and manage all the files of 3D models for their fleet in order for their mechanics to have them available to use in a timely manner. Therefore, it would be desirable to have a system and method that takes into account at least some of the issues discussed above, as well as other possible issues.

BRIEF SUMMARY

Example implementations of the present disclosure are directed to data compression and, in particular, to compressing binary geometry files for structural products such as aircraft or other vehicles. Example implementations make use of the repetitive nature component parts of a structural product, or across instances of a structural production. A master binary geometry file may be used to store only one model for each component part of a structural product or across instances of the structural product. A binary geometry file for the structural product may then be compressed using a substitution coding technique in which instances of the component part may be substituted for a reference to the component part in the master binary geometry file.

The present disclosure thus includes, without limitation, the following example implementations.

Some example implementations provide a method of compressing one or more binary geometry files for one or more structural products, the method comprising accessing a binary geometry file that contains a geometric model of a structural product that is formed of component parts, the geometric model including an assembly of geometric models of instances of the component parts; identifying the component parts of the structural product; generating a master binary geometry file for the structural product that contains geometric models of the component parts, the master binary geometry file containing only one geometric model of each component part; applying the binary geometry file to a coder that generates a corresponding compressed binary geometry file, the coder searching the binary geometry file for the geometric models of the instances of the component parts, and substituting references to respective ones of the geometric models of the component parts in the master binary geometry file; and storing the master binary geometry file and the corresponding compressed binary geometry file in persistent storage.

In some example implementations of the method of any preceding example implementation, or any combination of any preceding example implementations, the structural product includes multiple instances of a component part, and the assembly of the geometric models of the instances of the component parts includes a geometric model of each of the multiple instances of the component part, and wherein the coder substituting the references to the respective ones of the geometric models includes the coder substituting a reference to the one geometric model of the component part in the master binary geometry file, for the geometric model of each of the multiple instances of the component part.

In some example implementations of the method of any preceding example implementation, or any combination of any preceding example implementations, accessing the binary geometry file includes accessing multiple binary geometry files for multiple instances of a type of the structural product, wherein applying the binary geometry file includes applying the multiple binary geometry files to the coder that generates respective corresponding compressed binary geometry files, and wherein storing the master binary geometry file and the corresponding compressed binary geometry file includes storing the master binary geometry file and the respective corresponding compressed binary geometry files.

In some example implementations of the method of any preceding example implementation, or any combination of any preceding example implementations, the multiple instances of the type of the structural product are formed of respective component parts at least some but not all of which are common to the type of the structural product, wherein identifying the component parts includes identifying the respective component parts of the multiple instances of the type of the structural product, and wherein generating the master binary geometry file includes generating the master binary geometry file that contains geometric models of the respective component parts, the master binary geometry file containing only one geometric model of each of those of the respective component parts that are common to the type of the structural product.

In some example implementations of the method of any preceding example implementation, or any combination of any preceding example implementations, at least some but not all of the respective component parts are common to more than one but not all of the multiple instances of the type of the structural product, and wherein generating the master binary geometry file includes generating the master binary geometry file that contains only one geometric model of each of those of the respective component parts that are common to more than one but not all of the multiple instances of the type of the structural product.

In some example implementations of the method of any preceding example implementation, or any combination of any preceding example implementations, the method further comprises accessing a binary three-dimensional (3D) geometry file that contains a 3D model of the structural product, the 3D model including an assembly of 3D models of the instances of the component parts; producing an approximation of the 3D model of the structural product and thereby approximations of the 3D models of the instances of the component parts, including: tessellating the 3D model of the structural product and thereby the 3D models of the instances of the component parts, to approximate the 3D model and thereby the 3D models with respective 3D meshes composed of faces defined by a plurality of vertices; and removing at least some of the plurality of vertices, and thereby reducing in number the plurality of faces; and storing the approximation of the 3D model of the structural product as the geometric model in the binary geometry file, and the approximations of the 3D models of the instances of the component parts as the geometric models in the binary geometry file.

In some example implementations of the method of any preceding example implementation, or any combination of any preceding example implementations, the corresponding compressed binary geometry file includes the references to the respective ones of the geometric models of the component parts in the master binary geometry file, and commands that define relationships and positions of the geometric models in the assembly of the geometric models of the instances of the component parts, and wherein the method further comprises accessing the corresponding compressed binary geometry file from the persistent storage; rendering the geometric model of the structural product from the compressed binary geometry file, including: accessing the respective ones of the geometric models of the component parts in the master binary geometry file, using the references in the corresponding compressed binary geometry file; rendering the geometric models of the instances of the component parts, according to the respective ones of the geometric models of the component parts; and assembling the geometric models of the instances of the component parts, according to the commands in the corresponding compressed binary geometry file.

Some example implementations provide an apparatus for compressing one or more binary geometry files for one or more structural products, the apparatus comprising a memory configured to store computer-readable program code; and processing circuitry configured to access the memory, and execute the computer-readable program code to cause the apparatus to at least perform the method of any preceding example implementation, or any combination of any preceding example implementations.

Some example implementations provide a computer-readable storage medium for compressing one or more binary geometry files for one or more structural products, the computer-readable storage medium being non-transitory and having computer-readable program code stored therein that, in response to execution by processing circuitry, causes an apparatus to at least perform the method of any preceding example implementation, or any combination of any preceding example implementations.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

DETAILED DESCRIPTION

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless specified otherwise or clear from context, references to first, second or the like should not be construed to imply a particular order. A feature may be described as being above another feature (unless specified otherwise or clear from context) may instead be below, and vice versa; and similarly, features described as being to the left of another feature else may instead be to the right, and vice versa. As used herein, unless specified otherwise or clear from context, the "or" of a set of operands is the "inclusive or" and thereby true if and only if one or more of the operands is true, as opposed to the "exclusive or" which is false when all of the operands are true. Thus, for example, "[A] or [B]" is true if [A] is true, or if [B] is true, or if both [A] and [B] are true. Further, the articles "a" and "an" mean "one or more," unless specified otherwise or clear from context to be directed to a singular form. Like reference numerals refer to like elements throughout.

Example implementations of the present disclosure relate generally to data compression and, in particular, to compressing binary geometry files for structural products. Example implementations will be primarily described in conjunction with aircraft, but it should be understood that example implementations may be utilized in conjunction with a variety of other structural products. Examples of suitable structural products that may benefit from example implementations include vehicles including aircraft, as well as spacecraft, watercraft, motor vehicles, railed vehicles and the like. Furthermore, it should be understood that unless otherwise specified, the terms "data," "content," "digital content," "information," and similar terms may be at times used interchangeably.

Figure 1:
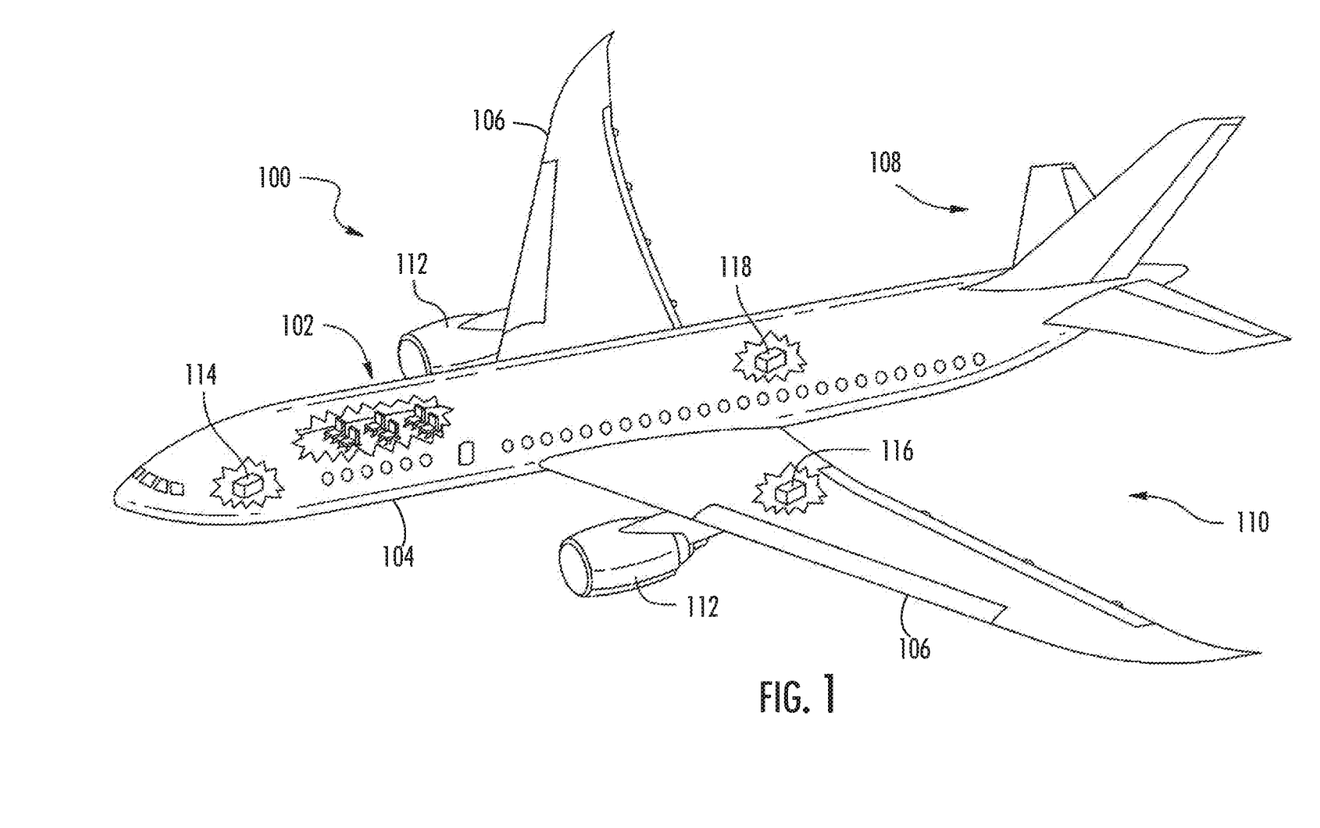
FIG. 1 illustrates an aircraft according to some example implementations of the present disclosure.

FIG. 1 illustrates one type of aircraft 100 that may benefit from example implementations of the present disclosure. As shown, the aircraft includes an airframe 102 with a fuselage 104, wings 106 and tail 108. The aircraft also includes a plurality of high-level systems 110 such as a propulsion system. In the particular example shown in FIG. 1, the propulsion system includes two wing-mounted engines 112. In other embodiments, the propulsion system can include other arrangements, for example, engines carried by other portions of the aircraft including the fuselage and/or the tail. The high-level systems may also include an electrical system 114, hydraulic system 116 and/or environmental system 118. Any number of other systems may be included.

Figure 2A:
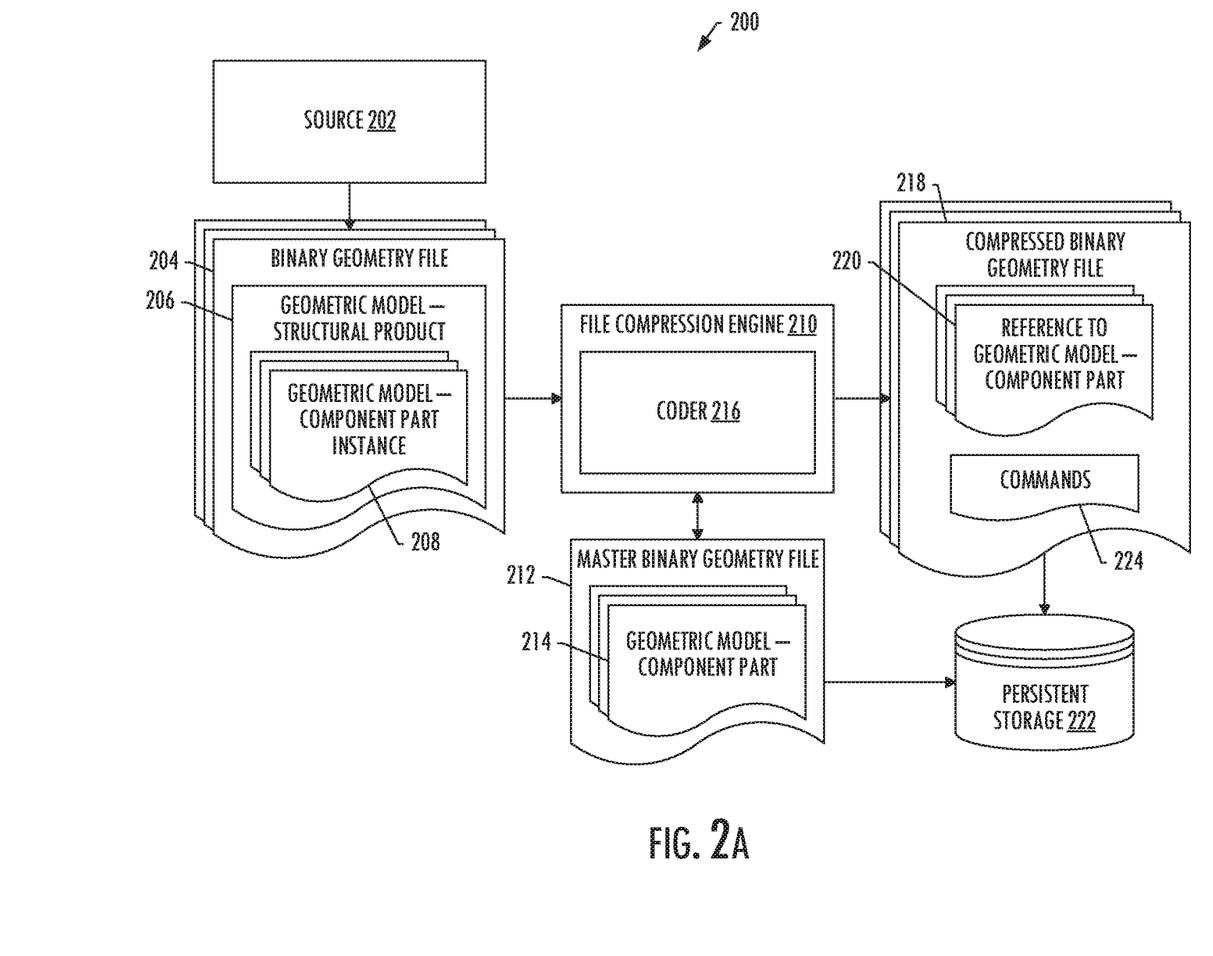
FIGS. 2A, 2B and 2C illustrate a system for compressing one or more binary geometry files for one or more structural products such as aircraft, according to some example implementations.
Figure 2B:
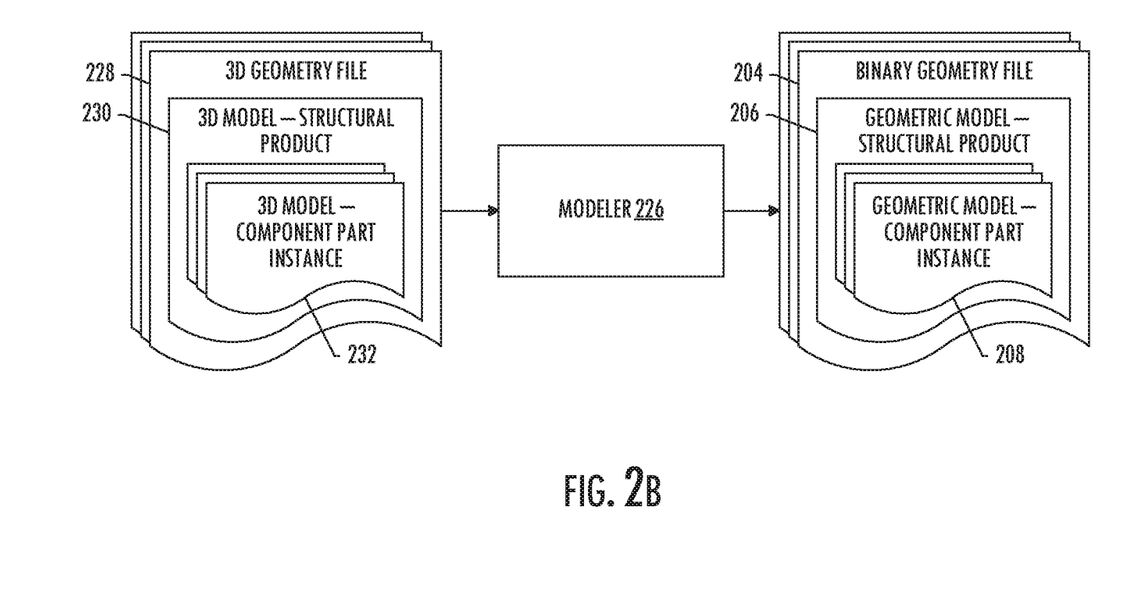
Figure 2C:
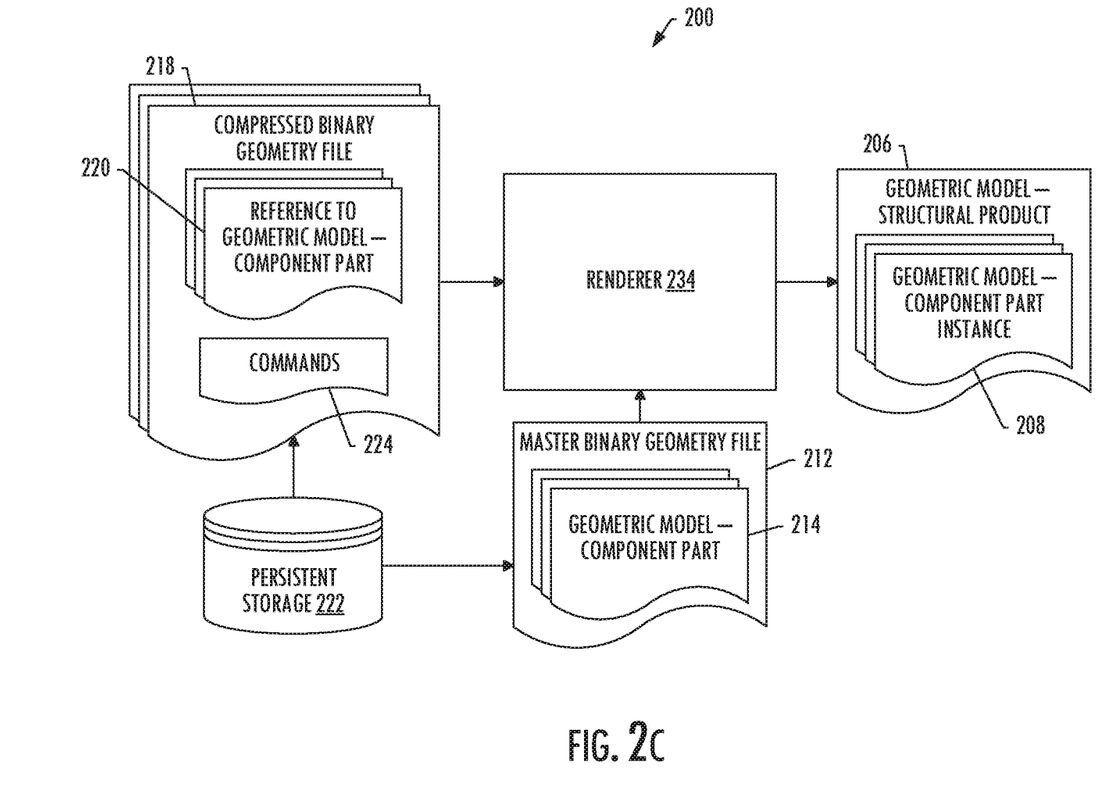

FIGS. 2A, 2B and 2C illustrate a system 200 for compressing one or more binary geometry files for one or more structural products such as aircraft 100, according to some example implementations. The system may include any of a number of different subsystems (each an individual system) for performing one or more functions or operations. As shown in FIG. 2A, in some examples, the system includes at least one source 202 of data. In some examples, the source includes a memory, storage or the like that may be located at a single source or distributed across multiple sources. The data may be stored in a number of different manners, such as in a database or flat files of any of a number of different types or formats.

In some examples, the data includes a binary geometry file 204 that contains a geometric model 206 of a structural product such as an aircraft. One example of a suitable geometric model is a three-dimensional (3D) model of the structural product. This 3D model may be a 3D computer-aided design (CAD) model or other similar model (sometimes referred to as a solid model) composed of 3D objects. The 3D model and its 3D objects may represent the structural product as a collection of "primitives" such as edges, faces, points (e.g., vertices) and the like, which may be arranged into polygons or other arithmetically-derived structures to reflect the geometry of surfaces, volumes or elements of the structural product. The structural product may be defined by a "boundary" representation, or collection of polygons that demarcate the space occupied by the structural product, which may include sub-collections of polygons that demarcate spaces occupied by respective elements of the structural product. For some structural products, the 3D model may use hundreds of thousands of polygons.

According to some example implementations, the structural product is formed of component parts, and the geometric model 206 includes an assembly of geometric models 208 of instances of the component parts. In this regard, a structural product may be composed of a number of component parts that are unique part designs, which may be identified by respective part numbers. These component parts exist independent of their instantiantions in the structural product. An instance of a component part is a unique copy or representation of the component part, and some are identified by serial number. A structural product therefore includes an assembly of instances of its component parts, and may include multiple instances of one or more of its component parts. In some examples in which the structural product includes multiple instances of a component part, then, the assembly of the geometric models of the instances of the component parts includes a geometric model of each of the multiple instances of the component part.

The system 200 of example implementations of the present disclosure includes a file compression engine 210 generally configured to compress the binary geometry file 204 that contains the geometric model 206 of the structural product. According to some example implementations, the file compression engine is configured to access the binary geometry file, and identify the component parts of the structural product. The file compression engine is configured to generate a master binary geometry file 212 for the structural product that contains geometric models 214 of the component parts. In this regard, the master binary geometry file contains only one geometric model of each component part (although the structural product may include more than one instance of a component part).

The file compression engine 210 is configured to apply the binary geometry file 204 to a coder 216 configured to generate a corresponding compressed binary geometry file 218. The coder is configured to search the binary geometry file for the geometric models 208 of the instances of the component parts, and substitute references 220 to respective ones of the geometric models 214 of the component parts in the master binary geometry file 212. The file compression engine is then configured to store the master binary geometry file 212 and the corresponding compressed binary geometry file in persistent storage 222.

Again, the structural product may include multiple instances of a component part, and the assembly of the geometric models 208 of the instances of the component parts may include a geometric model of each of the multiple instances of the component part. In some of these examples, the coder 216 is configured to substitute a reference 220 to the one geometric model 214 of the component part in the master binary geometry file 212, for the geometric model of each of the multiple instances of the component part. As also shown, in some examples, the corresponding compressed binary geometry file 218 (if not also the binary geometry file 204) also includes commands 224 that define relationships and positions of the geometric models in the assembly of the geometric models of the instances of the component parts.

In some examples, the file compression engine 210 is configured to access multiple binary geometry files 204 for multiple instances of a type of the structural product, such as multiple instances of a model of aircraft or other vehicle. In a particular example, the multiple binary geometry files may be for multiple aircraft of a fleet of a particular model of aircraft. These multiple instances may be formed of respective component parts some of which are considered standard equipment, and others considered optional equipment. At least some but not all of the respective component parts, then, may be common to the type of the structural product. Similarly, at least some but not all of the respective component parts may be common to more than one but not all of the multiple instances of the type of the structural product.

In some examples including multiple binary geometry files 204 for multiple instances of a type of the structural product, the file compression engine 210 is configured to identify the respective component parts of the multiple instances of the type of the structural product. The file compression engine is configured to generate the master binary geometry file 212 that contains geometric models 214 of the respective component parts. In some examples, the master binary geometry file contains only one geometric model of each of those of the respective component parts that are common to the type of the structural product (e.g., standard equipment). Additionally or alternatively, in some examples, the master binary geometry file contains only one geometric model of each of those of the respective component parts that are common to more than one but not all of the multiple instances of the type of the structural product (e.g., optional equipment).

Also in some examples including multiple binary geometry files 204 for multiple instances of a type of the structural product, the file compression engine 210 is configured to apply the multiple binary geometry files to the coder 216 that is configured to generate respective corresponding compressed binary geometry files 218. The file compression engine, then, is configured to store the master binary geometry file 212 and the respective corresponding compressed binary geometry files (in the persistent storage 222).

As will be appreciated, a large and complex structural product such as a modern aircraft may include millions of component parts, and a 3D model of the structural product may be greater than 4 terabytes in size. The size of the 3D model and limitations of computing hardware make it difficult to view all of the parts at one time. As shown in FIG. 2B, in some example implementations, the system 200 further includes a modeler 226 configured to access a binary 3D geometry file 228 (one or more) that contains a 3D model 230 of the structural product. The 3D model includes an assembly of 3D models 232 of the instances of the component parts.

The modeler 226 is configured to produce an approximation of the 3D model 230 of the structural product and thereby approximations of the 3D models 232 of the instances of the component parts. The modeler is configured to store the approximation of the 3D model of the structural product as the geometric model 206 in the binary geometry file 204, and the approximations of the 3D models of the instances of the component parts as the geometric models 208 in the binary geometry file. In particular, in some examples, the modeler is configured to tessellate the 3D model of the structural product and thereby the 3D models of the instances of the component parts, to approximate the 3D model and thereby the 3D models with respective 3D meshes. The 3D meshes are composed of faces defined by a plurality of vertices, and the modeler is configured to remove at least some of the plurality of vertices, and thereby reduce in number the plurality of faces.

As shown in FIG. 2C, in some examples, the system 200 further includes a renderer 234 configured to access the corresponding compressed binary geometry file 218 from the persistent storage 222, and render the geometric model 206 of the structural product from the compressed binary geometry file. In particular, for example, the renderer is configured to access the respective ones of the geometric models 214 of the component parts in the master binary geometry file 212, using the references in the corresponding compressed binary geometry file. The renderer is configured to render the geometric models 208 of the instances of the component parts, according to the respective ones of the geometric models of the component parts; and assemble the geometric models of the instances of the component parts, according to the commands 224 in the corresponding compressed binary geometry file.

FIGS. 3A, 3B, 3C and 3D are flowcharts illustrating various operations in a method 300 of compressing one or more binary geometry files for one or more structural products, according to example implementations of the present disclosure. As shown at block 302 of FIG. 3A, the method includes accessing a binary geometry file 204 that contains a geometric model 206 of a structural product that is formed of component parts, the geometric model including an assembly of geometric models 208 of instances of the component parts. As shown at blocks 304 and 306, the method includes identifying the component parts of the structural product, and generating a master binary geometry file 212 for the structural product that contains geometric models 214 of the component parts. According to some example implementations, the master binary geometry file contains only one geometric model of each component part.

Figure 3A:
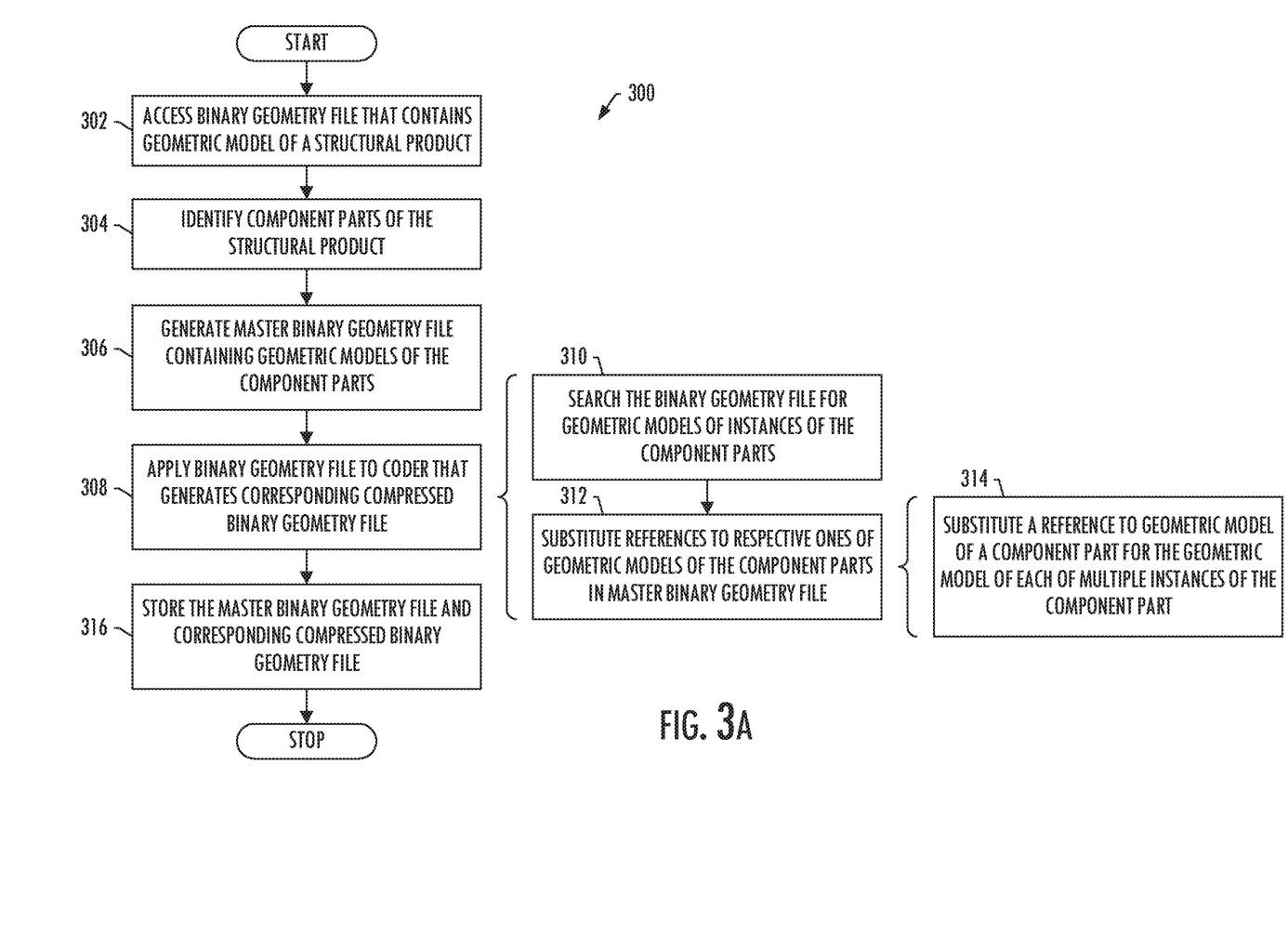
FIGS. 3A, 3B, 3C and 3D are flowcharts illustrating various operations in a method of compressing one or more binary geometry files for one or more structural products such as aircraft, according to some example implementations.

The method 300 includes applying the binary geometry file 204 to a coder 216 that generates a corresponding compressed binary geometry file 218, as shown at block 308. In this regard, the coder searches the binary geometry file for the geometric models 208 of the instances of the component parts, and substituting references 220 to respective ones of the geometric models 214 of the component parts in the master binary geometry file 212, as shown at blocks 310 and 312. In some examples, the structural product includes multiple instances of a component part, and the assembly of the geometric models of the instances of the component parts includes a geometric model of each of the multiple instances of the component part. In some of these examples, the coder substitutes a reference to the one geometric model of the component part in the master binary geometry file, for the geometric model of each of the multiple instances of the component part, as shown at block 314. The method further includes storing the master binary geometry file and the corresponding compressed binary geometry file in persistent storage 222, as shown at block 316.

Figure 3B:
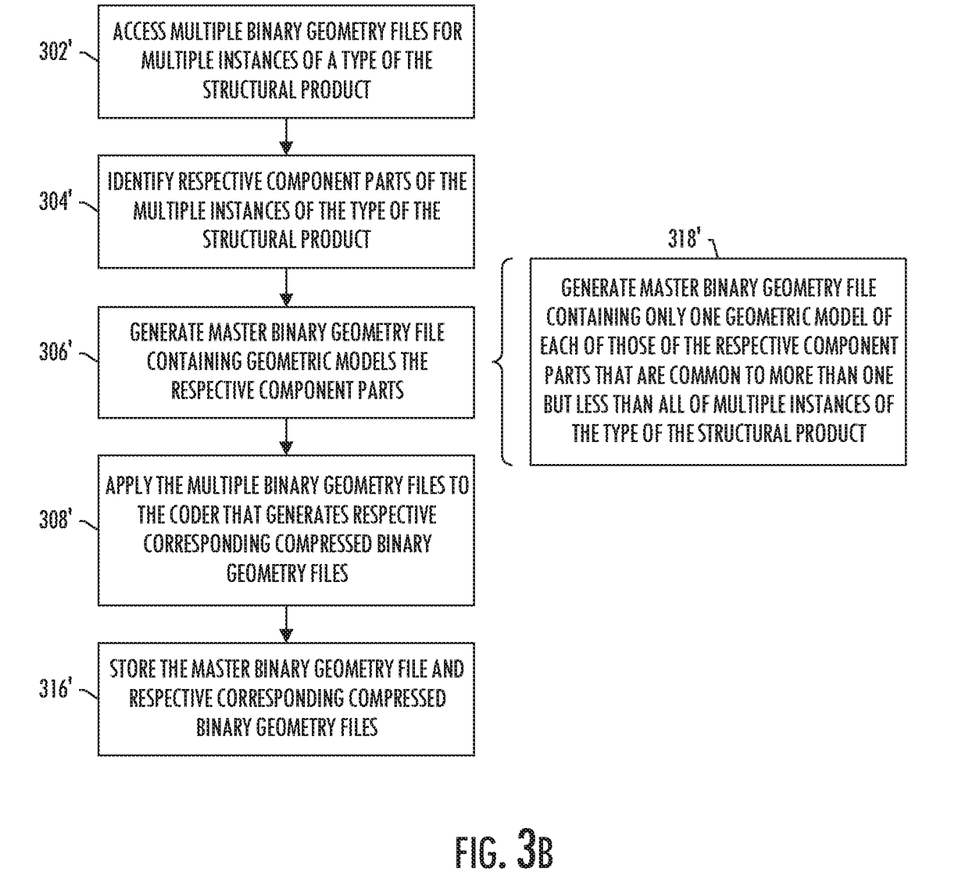

In some examples, multiple binary geometry files 204 for multiple instances of a type of the structural product are accessed, as shown at block 302M of FIG. 3B. In some of these examples, the multiple instances of the type of the structural product are formed of respective component parts at least some but not all of which are common to the type of the structural product. In these examples, the respective component parts of the multiple instances of the type of the structural product are identified, as shown at block 304M. Generating the master binary geometry file 212, then, includes generating the master binary geometry file that contains geometric models 214 of the respective component parts, as shown at block 306M. Here, the master binary geometry file contains only one geometric model of each of those of the respective component parts that are common to the type of the structural product.

As also shown in FIG. 3B, in some examples, the multiple binary geometry files 204 are applied to the coder 216 that generates respective corresponding compressed binary geometry files 218, as shown at block 308M. The master binary geometry file 212 and the respective corresponding compressed binary geometry files, then, are stored in the persistent storage 222, as shown at block 316M.

In some further examples, at least some but not all of the respective component parts are common to more than one but not all of the multiple instances of the type of the structural product. And in some of these further examples, the master binary geometry file 212 that is generated contains only one geometric model of each of those of the respective component parts that are common to more than one but not all of the multiple instances of the type of the structural product, as shown at block 318M.

Figure 3C:
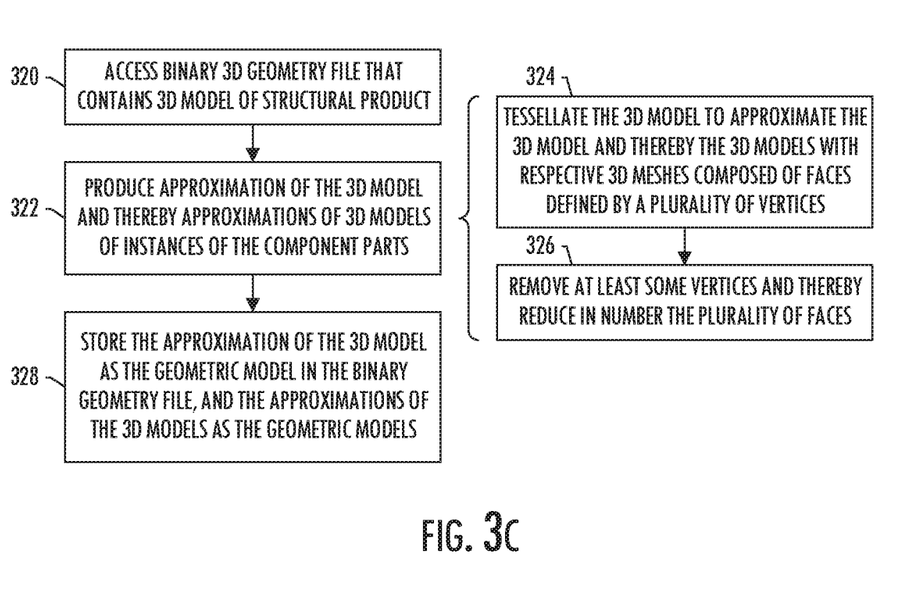

Turning to FIG. 3C, in some examples, the method 300 further includes accessing a binary three-dimensional (3D) geometry file 228 that contains a 3D model 230 of the structural product, as shown at block 320. The 3D model includes an assembly of 3D models 232 of the instances of the component parts. The method then also includes producing an approximation of the 3D model of the structural product and thereby approximations of the 3D models of the instances of the component parts, as shown at block 322. This approximation includes tessellating the 3D model of the structural product and thereby the 3D models of the instances of the component parts, to approximate the 3D model and thereby the 3D models with respective 3D meshes composed of faces defined by a plurality of vertices, as shown at block 324. The approximation also includes removing at least some of the plurality of vertices, and thereby reducing in number the plurality of faces, as shown at block 326. The approximation of the 3D model of the structural product is stored as the geometric model 206 in the binary geometry file 204, as are the approximations of the 3D models of the instances of the component parts as the geometric models 208 in the binary geometry file, as shown at block 328.

Figure 3D:
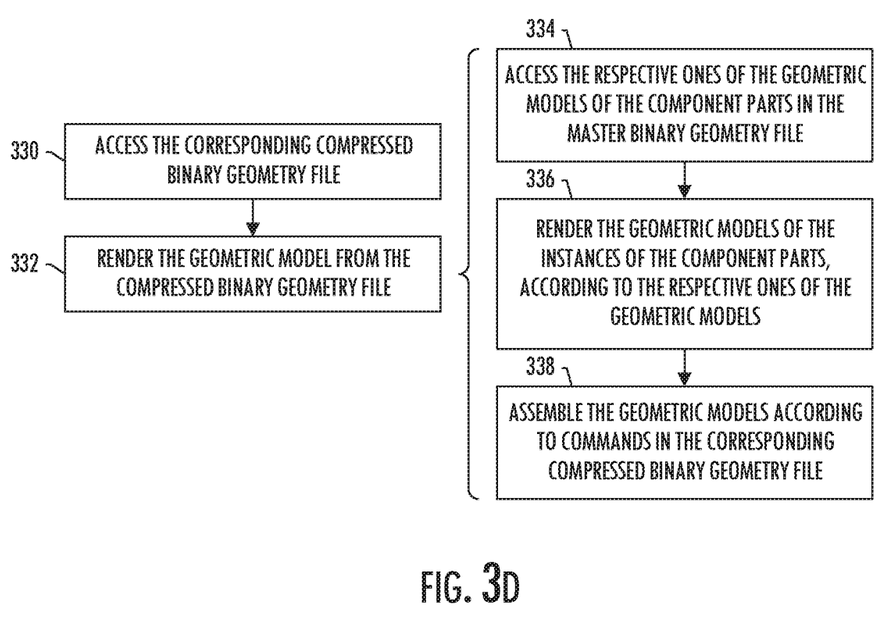

In some examples, the corresponding compressed binary geometry file 218 includes the references 220 to the respective ones of the geometric models 214 of the component parts in the master binary geometry file 212, and commands 224 that define relationships and positions of the geometric models in the assembly of the geometric models 208 of the instances of the component parts. In some of these examples, as shown in FIG. 3D, the method 300 further includes accessing the corresponding compressed binary geometry file from the persistent storage 222, and rendering the geometric model 206 of the structural product from the compressed binary geometry file, as shown at blocks 330 and 332. Rendering the geometric model includes accessing the respective ones of the geometric models of the component parts in the master binary geometry file, using the references in the corresponding compressed binary geometry file, as shown at block 334. The geometric models of the instances of the component parts are rendered according to the respective ones of the geometric models of the component parts, and the geometric models of the instances of the component parts are assembled, according to the commands in the corresponding compressed binary geometry file, as shown at blocks 336 and 338.

According to example implementations of the present disclosure, the system 200 and its subsystems including the source 202, file compression engine 210, coder 216, persistent storage 222, modeler 226 and/or renderer 234 may be implemented by various means. Means for implementing the system and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network or the like.

Figure 4:
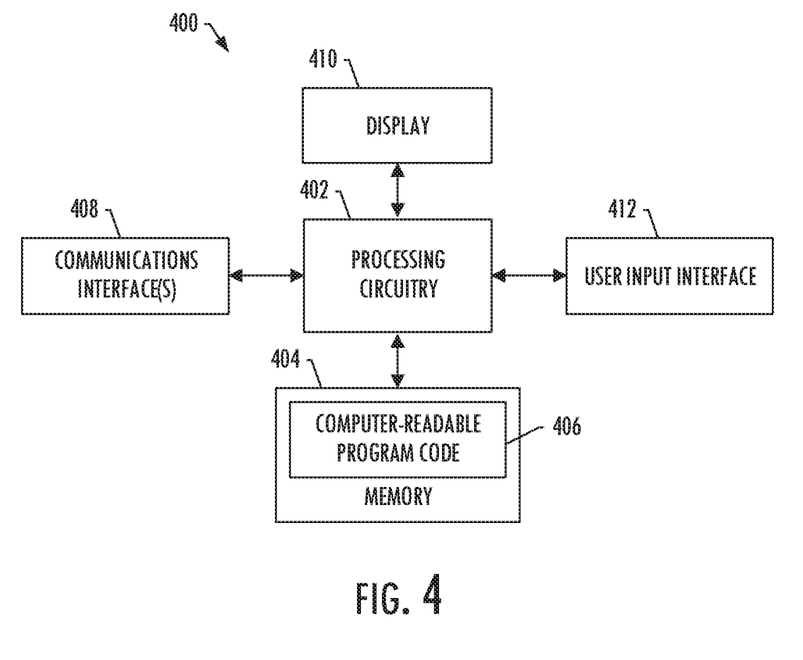
FIG. 4 illustrates an apparatus according to some example implementations.

FIG. 4 illustrates an apparatus 400 according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processing circuitry 402 (e.g., processor unit) connected to a memory 404 (e.g., storage device).

The processing circuitry 402 may be composed of one or more processors alone or in combination with one or more memories. The processing circuitry is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in the memory 404 (of the same or another apparatus).

The processing circuitry 402 may be a number of processors, a multi-core processor or some other type of processor, depending on the particular implementation. Further, the processing circuitry may be implemented using a number of heterogeneous processor systems in which a main processor is present with one or more secondary processors on a single chip. As another illustrative example, the processing circuitry may be a symmetric multi-processor system containing multiple processors of the same type. In yet another example, the processing circuitry may be embodied as or otherwise include one or more ASICs, FPGAs or the like. Thus, although the processing circuitry may be capable of executing a computer program to perform one or more functions, the processing circuitry of various examples may be capable of performing one or more functions without the aid of a computer program. In either instance, the processing circuitry may be appropriately programmed to perform functions or operations according to example implementations of the present disclosure.

The memory 404 is generally any piece of computer hardware that is capable of storing information such as, for example, data, computer programs (e.g., computer-readable program code 406) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 404, the processing circuitry 402 may also be connected to one or more interfaces for displaying, transmitting and/or receiving information. The interfaces may include a communications interface 408 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 410 and/or one or more user input interfaces 412 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processing circuitry that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by a processing circuitry, or storage of instructions in a computer-readable storage medium, supports combinations of operations for performing the specified functions. In this manner, an apparatus 400 may include a processing circuitry 402 and a computer-readable storage medium or memory 404 coupled to the processing circuitry, where the processing circuitry is configured to execute computer-readable program code 406 stored in the memory. It will also be understood that one or more functions, and combinations of functions, may be implemented by special purpose hardware-based computer systems and/or processing circuitry which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. An apparatus for compressing one or more binary geometry files for one or more structural products, the apparatus comprising:
    a memory configured to store computer-readable program code; and
    processing circuitry configured to access the memory, and execute the computer-readable program code to cause the apparatus to at least:
    access a binary geometry file that contains a geometric model of a structural product, the structural product being formed of component parts that exist independent of instantiations of the component parts in the structural product, and the geometric model including an assembly of geometric models of instances of the component parts, wherein the structural product includes multiple instances of a component part;
    identify the component parts of the structural product;
    generate a master binary geometry file for the structural product, the master binary geometry file containing only one geometric model of each component part of the structural product;
    apply the binary geometry file to a coder configured to generate a corresponding compressed binary geometry file, the coder configured to generate the corresponding compressed binary geometry file by searching the binary geometry file for the geometric models of the instances of the component parts, and substituting a reference to the one geometric model of the component part in the master binary geometry file, for the geometric model of each of the multiple instances of the component part; and store the master binary geometry file and the corresponding compressed binary geometry file in persistent storage.

2. The apparatus of claim 1, wherein assembly of the geometric models of the instances of the component parts includes a geometric model of each of the multiple instances of the component part.

3. The apparatus of claim 1, wherein the apparatus caused to access the binary geometry file includes the apparatus caused to access multiple binary geometry files for multiple instances of a type of the structural product, wherein the apparatus caused to apply the binary geometry file includes the apparatus caused to apply the multiple binary geometry files to the coder that is configured to generate respective corresponding compressed binary geometry files, and wherein the apparatus caused to store the master binary geometry file and the corresponding compressed binary geometry file includes the apparatus caused to store the master binary geometry file and the respective corresponding compressed binary geometry files.

4. The apparatus of claim 3, wherein the multiple instances of the type of the structural product are formed of respective component parts at least some but not all of which are common to the type of the structural product, wherein the apparatus caused to identify the component parts includes the apparatus caused to identify the respective component parts of the multiple instances of the type of the structural product, and wherein the apparatus caused to generate the master binary geometry file includes the apparatus caused to generate the master binary geometry file that contains geometric models of the respective component parts, the master binary geometry file containing only one geometric model of each of those of the respective component parts that are common to the type of the structural product.

5. The apparatus of claim 4, wherein at least some but not all of the respective component parts are common to more than one but not all of the multiple instances of the type of the structural product, and wherein the apparatus caused to generate the master binary geometry file includes the apparatus caused to generate the master binary geometry file that contains only one geometric model of each of those of the respective component parts that are common to more than one but not all of the multiple instances of the type of the structural product.

6. The apparatus of claim 1, wherein the processing circuitry is configured to execute the computer-readable program code to cause the apparatus to further:

access a binary three-dimensional (3D) geometry file that contains a 3D model of the structural product, the 3D model including an assembly of 3D models of the instances of the component parts;

produce an approximation of the 3D model of the structural product and thereby approximations of the 3D models of the instances of the component parts, including the apparatus caused to:

tessellate the 3D model of the structural product and thereby the 3D models of the instances of the component parts, to approximate the 3D model and thereby the 3D models with respective 3D meshes composed of faces defined by a plurality of vertices; and remove at least some of the plurality of vertices, and thereby reducing in number the plurality of faces; and store the approximation of the 3D model of the structural product as the geometric model in the binary geometry file, and the approximations of the 3D models of the instances of the component parts as the geometric models in the binary geometry file.

7. The apparatus of claim 1, wherein the corresponding compressed binary geometry file includes the references to respective ones of the geometric models of the component parts in the master binary geometry file, and commands that define relationships and positions of the geometric models in the assembly of the geometric models of the instances of the component parts, and wherein the processing circuitry is configured to execute the computer-readable program code to cause the apparatus to further:

access the corresponding compressed binary geometry file from the persistent storage;

render the geometric model of the structural product from the compressed binary geometry file, including the apparatus caused to:

access the respective ones of the geometric models of the component parts in the master binary geometry file, using the references in the corresponding compressed binary geometry file;

render the geometric models of the instances of the component parts, according to the respective ones of the geometric models of the component parts; and assemble the geometric models of the instances of the component parts, according to the commands in the corresponding compressed binary geometry file.

8. A method of compressing one or more binary geometry files for one or more structural products, the method comprising:

accessing a binary geometry file that contains a geometric model of a structural product, the structural product being formed of component parts that exist independent of instantiations of the component parts in the structural product, and the geometric model including an assembly of geometric models of instances of the component parts, wherein the structural product includes multiple instances of a component part;

identifying the component parts of the structural product;

generating a master binary geometry file for the structural product, the master binary geometry file containing only one geometric model of each component part of the structural product;

applying the binary geometry file to a coder that generates a corresponding compressed binary geometry file, the coder generating the corresponding compressed binary geometry file by searching the binary geometry file for the geometric models of the instances of the component parts, and substituting a reference to the one geometric model of the component part in the master binary geometry file, for the geometric model of each of the multiple instances of the component part; and storing the master binary geometry file and the corresponding compressed binary geometry file in persistent storage.

9. The method of claim 8, wherein the assembly of the geometric models of the instances of the component parts includes a geometric model of each of the multiple instances of the component part.

10. The method of claim 8, wherein accessing the binary geometry file includes accessing multiple binary geometry files for multiple instances of a type of the structural product,
   wherein applying the binary geometry file includes applying the multiple binary geometry files to the coder that generates respective corresponding compressed binary geometry files, and
   wherein storing the master binary geometry file and the corresponding compressed binary geometry file includes storing the master binary geometry file and the respective corresponding compressed binary geometry files.

11. The method of claim 10, wherein the multiple instances of the type of the structural product are formed of respective component parts at least some but not all of which are common to the type of the structural product,
   wherein identifying the component parts includes identifying the respective component parts of the multiple instances of the type of the structural product, and
   wherein generating the master binary geometry file includes generating the master binary geometry file that contains geometric models of the respective component parts, the master binary geometry file containing only one geometric model of each of those of the respective component parts that are common to the type of the structural product.

12. The method of claim 11, wherein at least some but not all of the respective component parts are common to more than one but not all of the multiple instances of the type of the structural product, and
   wherein generating the master binary geometry file includes generating the master binary geometry file that contains only one geometric model of each of those of the respective component parts that are common to more than one but not all of the multiple instances of the type of the structural product.

13. The method of claim 8 further comprising:
   accessing a binary three-dimensional (3D) geometry file that contains a 3D model of the structural product, the 3D model including an assembly of 3D models of the instances of the component parts;
   producing an approximation of the 3D model of the structural product and thereby approximations of the 3D models of the instances of the component parts, including:
   tessellating the 3D model of the structural product and thereby the 3D models of the instances of the component parts, to approximate the 3D model and thereby the 3D models with respective 3D meshes composed of faces defined by a plurality of vertices; and
   removing at least some of the plurality of vertices, and thereby reducing in number the plurality of faces; and
   storing the approximation of the 3D model of the structural product as the geometric model in the binary geometry file, and the approximations of the 3D models of the instances of the component parts as the geometric models in the binary geometry file.

14. The method of claim 8, wherein the corresponding compressed binary geometry file includes the references to respective ones of the geometric models of the component parts in the master binary geometry file, and commands that define relationships and positions of the geometric models in the assembly of the geometric models of the instances of the component parts, and wherein the method further comprises:
   accessing the corresponding compressed binary geometry file from the persistent storage;
   rendering the geometric model of the structural product from the compressed binary geometry file, including:
   accessing the respective ones of the geometric models of the component parts in the master binary geometry file, using the references in the corresponding compressed binary geometry file;
   rendering the geometric models of the instances of the component parts, according to the respective ones of the geometric models of the component parts; and
   assembling the geometric models of the instances of the component parts, according to the commands in the corresponding compressed binary geometry file.

15. A computer-readable storage medium for compressing one or more binary geometry files for one or more structural products, the computer-readable storage medium being non-transitory and having computer-readable program code stored therein that, in response to execution by processing circuitry, causes an apparatus to at least:
   access a binary geometry file that contains a geometric model of a structural product, the structural product being formed of component parts that exist independent of instantiations of the component parts in the structural product, and the geometric model including an assembly of geometric models of instances of the component parts, wherein the structural product includes multiple instances of a component part;
   identify the component parts of the structural product;
   generate a master binary geometry file for the structural product, the master binary geometry file containing only one geometric model of each component part of the structural product;
   apply the binary geometry file to a coder configured to generate a corresponding compressed binary geometry file, the coder configured to generate the corresponding compressed binary geometry file by searching the binary geometry file for the geometric models of the instances of the component parts, and substituting a reference to the one geometric model of the component part in the master binary geometry file, for the geometric model of each of the multiple instances of the component part; and
   store the master binary geometry file and the corresponding compressed binary geometry file in persistent storage.

16. The computer-readable storage medium of claim 15, wherein the assembly of the geometric models of the instances of the component parts includes a geometric model of each of the multiple instances of the component part.

17. The computer-readable storage medium of claim 15, wherein the apparatus caused to access the binary geometry file includes the apparatus caused to access multiple binary geometry files for multiple instances of a type of the structural product,
   wherein the apparatus caused to apply the binary geometry file includes the apparatus caused to apply the multiple binary geometry files to the coder that is configured to generate respective corresponding compressed binary geometry files, and
   wherein the apparatus caused to store the master binary geometry file and the corresponding compressed binary geometry file includes the apparatus caused to store the master binary geometry file and the respective corresponding compressed binary geometry files.

18. The computer-readable storage medium of claim 17, wherein the multiple instances of the type of the structural product are formed of respective component parts at least some but not all of which are common to the type of the structural product,
  wherein the apparatus caused to identify the component parts includes the apparatus caused to identify the respective component parts of the multiple instances of the type of the structural product, and
  wherein the apparatus caused to generate the master binary geometry file includes the apparatus caused to generate the master binary geometry file that contains geometric models of the respective component parts, the master binary geometry file containing only one geometric model of each of those of the respective component parts that are common to the type of the structural product.

19. The computer-readable storage medium of claim 18, wherein at least some but not all of the respective component parts are common to more than one but not all of the multiple instances of the type of the structural product, and
  wherein the apparatus caused to generate the master binary geometry file includes the apparatus caused to generate the master binary geometry file that contains only one geometric model of each of those of the respective component parts that are common to more than one but not all of the multiple instances of the type of the structural product.

20. The computer-readable storage medium of claim 15, wherein the computer-readable program code, in response to execution by the processing circuitry, causes the apparatus to further:
  access a binary three-dimensional (3D) geometry file that contains a 3D model of the structural product, the 3D model including an assembly of 3D models of the instances of the component parts;
  produce an approximation of the 3D model of the structural product and thereby approximations of the 3D models of the instances of the component parts, including the apparatus caused to:
  tessellate the 3D model of the structural product and thereby the 3D models of the instances of the component parts, to approximate the 3D model and thereby the 3D models with respective 3D meshes composed of faces defined by a plurality of vertices; and
  remove at least some of the plurality of vertices, and thereby reducing in number the plurality of faces; and
  store the approximation of the 3D model of the structural product as the geometric model in the binary geometry file, and the approximations of the 3D models of the instances of the component parts as the geometric models in the binary geometry file.

* * * * *